United States Patent [19]

Balliet

[11] 3,979,691

[45] Sept. 7, 1976

[54] ACQUISITION PROCESS IN A PHASE-LOCKED-LOOP BY SWITCHED PHASE MEANS

[75] Inventor: Layton Balliet, Huntsville, Ala.

[73] Assignee: International Business Machines Corporation, Armonk, N.Y.

[22] Filed: June 30, 1975

[21] Appl. No.: 591,385

[52] U.S. Cl. .................................. 331/1 A; 331/17
[51] Int. Cl.² ........................................... H03B 3/04
[58] Field of Search ............... 328/155; 331/1 A, 17

[56] References Cited
UNITED STATES PATENTS

| | | | |
|---|---|---|---|
| 3,639,852 | 2/1972 | Boyer | 331/1 A |
| 3,795,870 | 3/1974 | Sanders | 331/1 A |
| 3,810,036 | 5/1974 | Bloedorn | 331/17 |

Primary Examiner—John S. Heyman
Attorney, Agent, or Firm—John G. Wynn

[57] ABSTRACT

A phase-locked-loop circuit configuration is described which eliminates the statistical nature of the acquisition process, thereby improving or decreasing the acquisition or lock-up-time of the loop. The circuit configuration is such that given an input signal, that occurs at time $T_0$, the loop error signal is reduced to a level where the lock-up-time is substantially reduced and predictable to a degree of certainty heretofore unattainable. In addition, by eliminating the statistical nature of the acquisition process, lock-up-time becomes a function of controllable system parameters, such as bandwidth, gain and circuit time constants.

3 Claims, 6 Drawing Figures

ACQUISITION PROCESS IN A PHASE-LOCKED-LOOP BY SWITCHED PHASE MEANS

CROSS REFERENCE TO RELATED APPLICATION

Application Ser. No. 595,250, filed July 11, 1975, entitled "Acquisition Process In a Phase-Locked-Loop By Gated Means" by Lawrence John Rettinger, Jr. and Layton Balliet, and assigned to the same assignee as this application contains related subject matter.

BACKGROUND OF THE INVENTION

1. Field of the Invention

The invention relates generally to improvements in phase-locked-loop systems, and more particularly, to a phase-locked-loop circuit configuration which eliminates the statistical nature of the acquisition process, thereby, affording a substantial reduction in, and predictability of loop lock-up-time.

2. Description of the Prior Art

A basic prior art phase-locked-loop is depicted in FIG. 1a. Initially, a signal coupled to input signal conductor 10 is applied to phase detector 12. This signal is compared in phase detector 12 with a feedback signal applied to conductor 14 by free-running controlled oscillator 16. Depending on the application employed, controlled oscillator 16 is disclosed in the prior art either as a voltage controlled oscillator (VCO), or a current controlled oscillator (CCO). Consequently, the output of phase detector 12 at conductor 18 is an error signal which is a function of the phase difference between the input signal at conductor 10 and the feedback signal at conductor 18. This error signal, in turn, is applied to loop filter 20, which conditions the error signal providing at conductor 22 a signal suitable for controlling controlled oscillator 16. The signal at conductor 22 is such as to cause a change in the frequency of operation of controlled oscillator 16 in a direction that reduces the error signal at conductor 18 to a minimum level. This is the classic locked condition of a phase-locked-loop and, accordingly, the output signal at conductor 14 tracks the input signal at conductor 10.

Acquisition or the time it takes a phase-locked-loop, such as the circuit of FIG. 1a, to lock up is statistical or random in nature. In some applications, such as standard radio communications and color television communications the acquisition process is not of primary importance when weighed against overall system design goals. Thus, the basic phase-locked-loop of FIG. 1a would suffice, in the previously indicated applications, notwithstanding the statistical nature of acquisition. However, in some other communication applications, such as digital communication systems and space communication systems, it is important to be able to decode or demodulate the intelligence immediately, since a delay could mean the loss of valuable information; therefore, the acquisition process is of primary importance. In addition to fast acquisition, predictable acquisition is also important in systems of the type aforementioned. Thus, the acquisition process can be broken down into two components, i.e., speed of acquisition and the predictability of acquisition. The separate components, to some degree, are dependent on each other.

The statistical nature of the acquisition process can better be understood by referring to the phase plane diagram, for a first order phase-locked-loop, illustrated in FIG. 1b. Although the phase-locked-loop, previously described, in FIG. 1a, is a second order system, the phase plane diagram of FIG. 1b will suffice to explain the acquisition process. In FIG. 1b, $\phi$ is the phase of the feedback signal relative to the input signal, and $\dot\phi$ is the rate of change of phase and is proportional to the error signal. Acquisition is defined, in the art, as the time required for a phase-locked-loop to reach a condition where the error signal is near zero at a stable null (depicted as $\pi/2$ in FIG. 1b). As is well known, some error signal is always necessary in order for the loop to track properly once acquisition is attained. Thus, as will be explained hereinbelow, theoretically, acquisition in the phase-locked-loop of FIG. 1a can vary from zero to infinity.

Concurrently referring to the basic phase-locked-loop of FIG. 1a and the phase plane diagram of FIG. 1b, a signal energizing the loop at conductor 10 has a probability of being in phase with free-running controlled oscillator 16. This in phase stable condition is depicted in FIG. 1b as the stable null $\pi/2$. There is also a probability that an input signal, when initially recieved, will be 180° out of phase with free-running controlled oscillator 16. This condition is depicted in FIG. 1b as the unstable null at $3\pi/2$ or the unstable null at $-3\pi/2$. In addition, there is a probability that the phase relationship between the input signal and controlled oscillator 16 is initially at some point between the previously mentioned limits and the stable null $\pi/2$. In actual practice, however, the loop will not stay at an unstable null for an indefinite time, primarily, due to system perturbations, such as noise. Accordingly, as is illustrated in FIG. 1b, controlled oscillator 16, at some point in time, will be driven off of the unstable nulls following the path indicated by the arrows. For example, if controlled oscillator 16, after the application of an input signal, is instantaneously at either of the unstable nulls $3\pi/2$ or $-3\pi/2$, controlled oscillator 16 will stay at one of the previously mentioned unstable nulls. But given a change in system conditions, such as frequency or noise, controlled oscillator 16 will be driven off of the unstable null, following the path indicated by the arrows, increasing its velocity $\dot\phi$, and finally, arriving at the stable $\pi/2$. However, the time it takes to accomplish the foregoing is indeterminate, since there is no assurance of how long the system will stay on an unstable null. Of course, once the system is driven from an unstable null, the time it takes to reach a stable null depends on the inertia in the system and can be determined to a degree of certainty by the parameters of the system. Computer studies have been made, given a random input signal, to determine the probability of acquisition for phase-locked-loops of the type depicted in FIG. 1a. For example, see, S. L. Goldman's article, entitled "Second-Order Phase-Locked-Loop Acquisition Time in the Presence or Narrow-Band Gaussian Noise," *IEEE Transactions on Communications*, 297–300, October, 1973.

There are methods, according to the prior art, to improve acquisition. One well known method is to increase the loop bandwidth. As is known to those with skill in the art, increasing the bandwidth of the loop increases $\dot\phi$, the rate of change of phase. As previously mentioned, $\dot\phi$ is proportional to the error signal; therefore, increasing the bandwidth of the loop improves acquisition since an increase in $\dot\phi$ increases the loop acceleration allowing the loop oscillator to approach a stable null more quickly (see FIG. 1b). Nevertheless, there is still a probability during initial acquisition to be on an unstable null. Accordingly, there is still an uncertainty, even though the uncertainty has been improved, as to how long the system will remain on an unstable null.

Another method, that is well documented in the prior art, is the utilization of a sweep frequency. This method definitely improves acquisition, especially if the phase-locked-loop is on an unstable null initially. On the other hand, if the phase-locked-loop is off of an unstable null initially, the utilization of a sweep technique can drive the system into an unstable null, since there is no prior knowledge as to the proper direction to sweep. Consequently, while the aforesaid technique improves acquisition, there is still an uncertainty when utilizing this method.

Still another prior art technique, which operates in practice similarly to the sweep technique, is to inject noise into the system. Given that the system is initially on an unstable null, the injected noise will drive the system off of the unstable null at a predetermined time depending only on when the noise is applied. Thus, theoretically, the system will be driven off of an unstable null more quickly. But unfortunately, there is always the probability that, initially, the system will be at some point between a stable null and an unstable null; therefore, there is always a probability that the injected noise will drive the system into an unstable null rather than a stable null. This possibility is clearly depicted in FIG. 1b.

Other elaborate and sophisticated prior art systems have been devised to improve acquisition such as the "Automatic Carrier Acquisition System" of Fletcher et al., U.S. Pat. No. 3,746,998; the "Quadriphase Modem" system of Wolejsza, Jr., U.S. Pat. No. 3,594,651; and the "Automatic Signal Acquisition Means for Phase-Lock Loop with Anti-Sideband Lock Protection" of Brown et al., U.S. Pat. No. 3,768,030.

While all of the aforementioned prior art systems and techniques tend to improve the acquisition process, the uncertainties, which tend to make it difficult to predict acquisition with a degree of accuracy necessary for reliable utilization of phase-locked-loops in communication systems of the type previously mentioned, have not been eliminated.

OBJECTS OF THE INVENTION

Accordingly, a principle object of the present invention is to eliminate the statistical nature of the acquisition process.

A further object of the present invention is to improve acquisition, with certainty, to a level heretofore unobtainable.

SUMMARY OF THE INVENTION

The phase-locked-loop circuit configuration, according to the invention, by which these and other objects, features and advantages are accomplished is characterized by a $3\pi/2$ phase detector for comparing an input signal and a feedback signal generated by a conventional free-running phase-locked-loop. In addition, the input signal is also applied, simultaneously, to a signal presence indicator, a 180° phase delayer and a phase selection switch. The processed signals from the signal presence indicator, the 180° phase delayer and the aforementioned $3\pi/2$ phase detector are also applied, in turn, to the previously mentioned phase selection switch. Consequently, if an output signal, as generated by the conventional free-running phase-locked-loop, is in phase with the input signal, i.e., the phase difference is such that the system is operating at a stable null $\pi/2$, the phase selection switch selects an error signal of the proper phase, thereby assuring system lock up at the stable null $\pi/2$.

On the other hand, if the output signal, as generated by the previously mentioned conventional free-running phase-locked-loop is 180° out of phase with the input signal, i.e., the phase difference is such that the system is operating at an unstable null $3\pi/2$ or $-3\pi/2$, the phase selection switch selects an error signal of the proper phase, thereby, immediately driving the convention free-running phase-locked-loop off of the aforesaid unstable null $3\pi/2$ or $-3\pi/2$ towards the stable null $\pi/2$ where reliable system lock up and tracking are assured.

Finally, if the output signal as generated by the free-running conventional phase-locked-loop is out of phase with the input signal at some immediate phase, i.e., the phase difference is such that the system is operating between the unstable null $3\pi/2$ and the stable null $\pi/2$ or between the unstable null $-3\pi/2$ and the stable null $\pi/2$, the phase selection switch selects an error signal of the proper phase driving the free-running conventional phase-locked-loop towards the stable null $\pi/2$ in an expeditious manner, thereby assuring reliable lock up and tracking of the input signal.

Moreover, as is clear from the foregoing, the phase-locked-loop circuit configuration of the instant invention eliminates the statistical nature of acquisition. Concomitantly, the speed of acquisition is improved, and is now limited, only, by controllable system parameters, aforementioned in the "Background of the Invention."

BRIEF DESCRIPTION OF THE DRAWINGS

The foregoing and other objects, novel features and advantages of the invention will be apparent from the following more particular description of the preferred embodiment as illustrated in the accompanying drawings, in which.

DESCRIPTION OF THE PREFERRED EMBODIMENT

Figure 2:
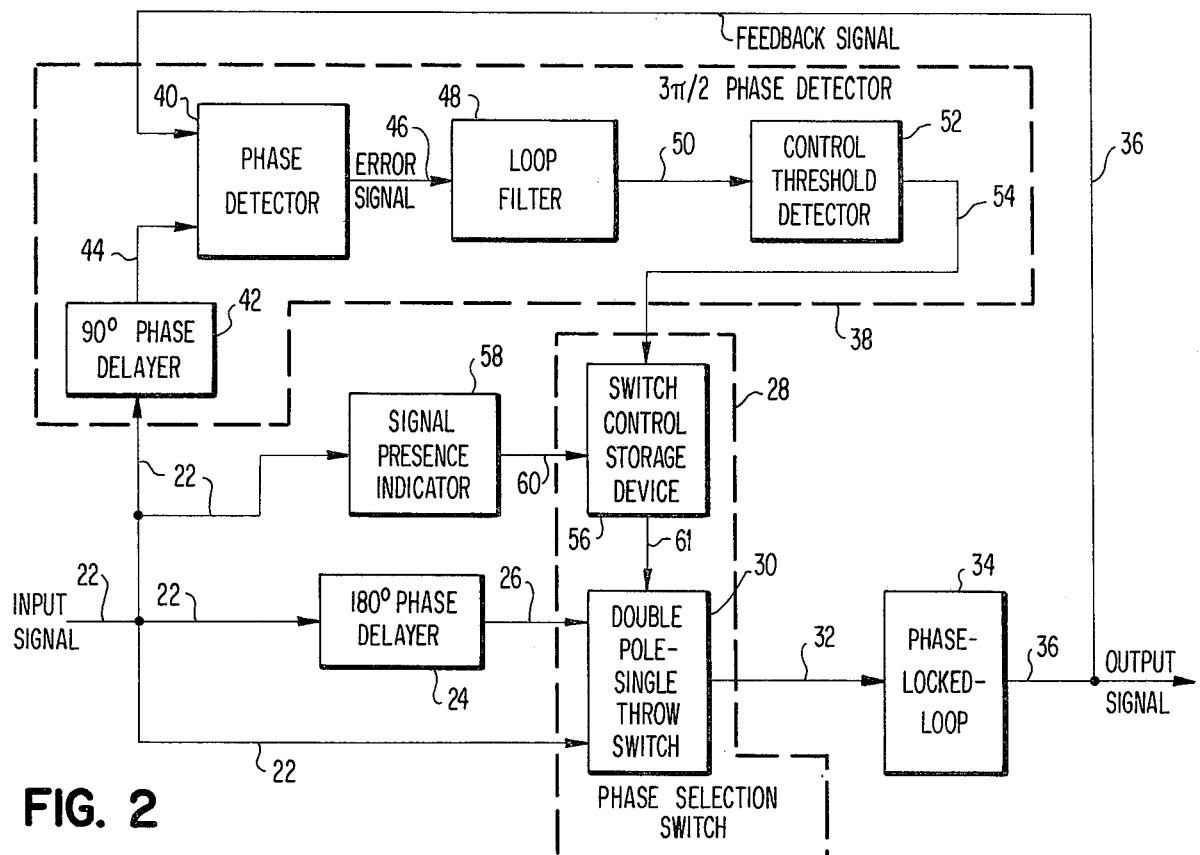
FIG. 2 is a block diagram representation of the preferred embodiment of the phase-locked-loop configuration of the present invention.

FIG. 2 shows, in block diagram form, an embodiment of the switched phase phase-locked-loop configuration of the present invention. The invention is in the combination embodied in the configuration shown and the improved results obtained therefrom. The invention, as characterized by the circuit blocks in FIG. 2, can easily be fabricated, it is believed, by one with ordinary skill after a perusal of the description of the invention, hereinbelow, and the "Statement of the Operation" of the invention, hereintofollow.

Still referring to FIG. 2, a signal is inputted on input signal conductor 22 and applied to 180° phase delayer 24. For purposes of the invention, 180° phase delayer 24 is an active inverter circuit which provides an output identical to the input except for a 180° phase delay. 180° phase delayer 24 can also be a passive delay line or any other device which accomplishes the indicated function. Continuing, the output of 180° phase delayer 24 is applied, via 180° phase delayer output conductor 26, to a first component of phase selection switch 28, the first component being double pole-single throw switch 30.

Double pole-single throw switch 30, for purposes of the invention, is a logic switch comprised of a first AND gate having a first input connected to 180° phase delayer output conductor 26, and its output connected to a first input of an OR gate. In addition, a second AND gate having a first input connected directly to input signal conductor 22, and its output connected to a second input of the aforementioned OR gate completes the configuration of double pole-single throw switch 30. The output of the OR gate, internal to double pole-single throw switch 30, is phase selection switch output conductor 32.

Figure 1A:
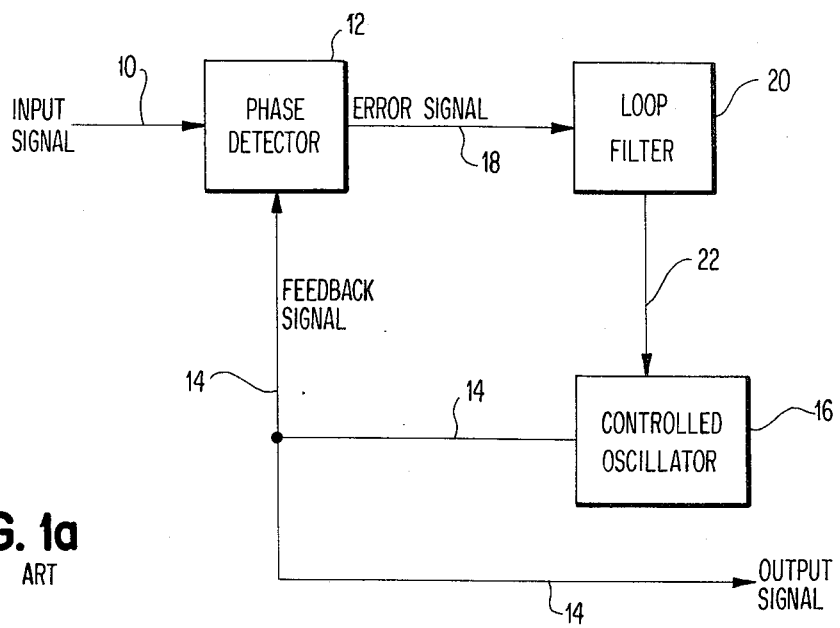
FIG. 1a is a block diagram representation of a conventional phase-locked-loop utilized, in combination, as an element of the present invention; and, also utilized to illustrate and explain the acquisition process.
Figure 1B:
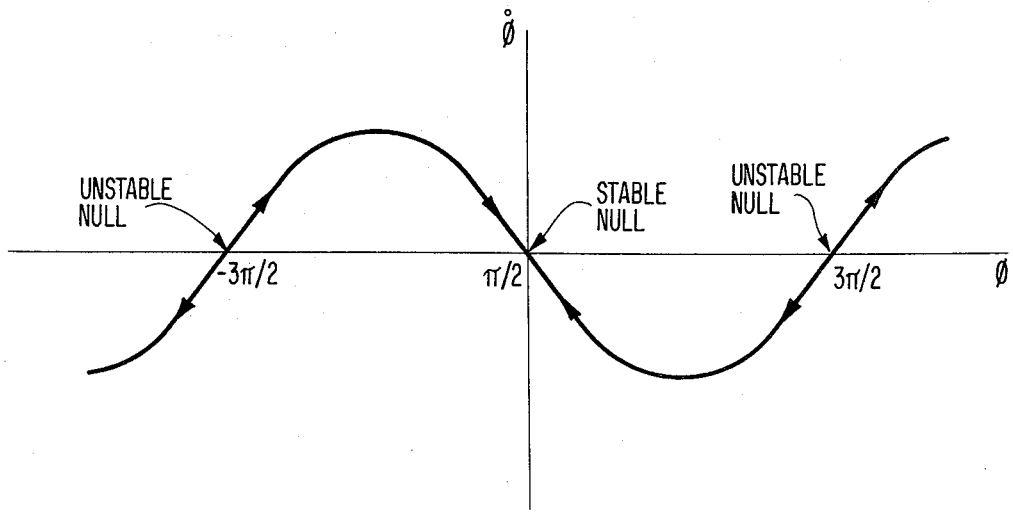
FIG. 1b is a first order phase plane diagram utilized to further illustrate and explain the acquisition process.

Still referring to the block diagram of FIG. 2, phase selection switch output conductor 32 is connected to a conventional free-running phase-locked-loop 34. Phase-locked-loop 34 is of the type previously described in the "Background of the Invention." Accordingly, phase-locked-loop 34 is of the second order. However, the order of the phase-locked-loop utilized in the invention is a choice open to anyone with ordinary skill in the art. It is also well known that the order of the loop determines, to a large measure, the value of $\phi$ which has an effect on the speed of acquisition. Further clarifying, phase selection switch output conductor 32 is tantamount to signal input conductor 10 of FIG. 1b. Also, phase-locked-loop output conductor 36 is tantamount to output conductor 14 of FIG. 1b.

Referring again to FIG. 2, the output signal and feedback signal are provided at phase-locked-loop output conductor 36. Consequently, conductor 36 is connected to a first component of $3\pi/2$ phase detector 38, the first component being phase detector 40. Also, connected to a second component of $3\pi/2$ phase detector 38, the second component being 90° phase delayer 42, is input signal conductor 22 aforementioned. For purposes of the invention, 90° phase delayer 42 is an active filter which is well documented in the art. A passive delay line or any other device that provides the function indicated could also be utilized. In addition, it should be apparent from a perusal of FIG. 2, that 90° phase delayer 42 could also provide 90° of the 180° of 180° phase delayer 24. Thus, 180° phase delayer 24 could be a 90° phase delayer, similar to 90° phase delayer 42, with its input connected to 90° phase delayer output conductor 44. The foregoing modification, however, is considered a choice open to anyone with ordinary skill in the art.

Continuing with the present embodiment depicted in FIG. 2, the output of 90° phase delayer 42, via 90° phase delayer output conductor 44, is connected to a second input of phase detector 40. For purposes of the invention, phase detector 40 is an EXCLUSIVE OR circuit. As is well known, an EXCLUSIVE OR circuit with two inputs, as shown in FIG. 2, is also termed a half-adder. Thus, the circuit provides a logical 1 when the input variables are different and a logical 0 when the input variables are the same. Accordingly, an EXCLUSIVE OR circuit operates as a phase detector and is widely used for this purpose in digital applications.

The error signal generated by phase detector 40, on phase detector output conductor 46, is applied to loop filter 48. Loop filter 48 is a resistor-capacitor filter that filters out high frequency peak noise that can disrupt subsequent circuit functions. Depending on system requirements, loop filter 48 can be an active filter rather than the passive filter utilized in the invention.

Continuing, the output of loop filter 48, via loop filter output conductor 50, drives control threshold detector 52. As contemplated by the invention, control threshold detector 52 has a means for setting a reference threshold level. Differential operational amplifiers are well known in the art and can be utilized as a threshold detector suitable for purposes of the invention. The output of control threshold detector 52, via control threshold detector output conductor 54, is applied to switch control storage device 56, a second component of phase selection switch 28 aforementioned. Also, driving switch control storage device 56 is signal presence indicator 58, via signal presence indicator output conductor 60. In addition, the input signal on input signal conductor 22 drives signal presence indicator 58 as shown in FIG. 2.

Finally, switch control device 56, for purposes of the invention, is a logic flip-flop providing a signal, via switch control storage device output conductor 61, to double pole-single throw switch 30. Switch control storage device output conductor 61, in fact, is connected to second inputs of the first and second AND gates, aforementioned in conjunction with a description of a possible fabrication of double pole-single throw switch 30. Also, signal presence indicator 58, for purposes of the invention, is comprised of a fast charge/slow discharge coupling circuit having a diode input and a resistor-capacitor to ground and an active device for amplification. This circuit, as utilized in the instant invention, is well known in the art. Accordingly, any circuit configuration which performs the indicated function would suffice.

STATEMENT OF THE OPERATION

Details of the operation, according to the invention, is explained in conjunction with FIGS. 2 and 3 viewed concurrently.

Figure 3A:
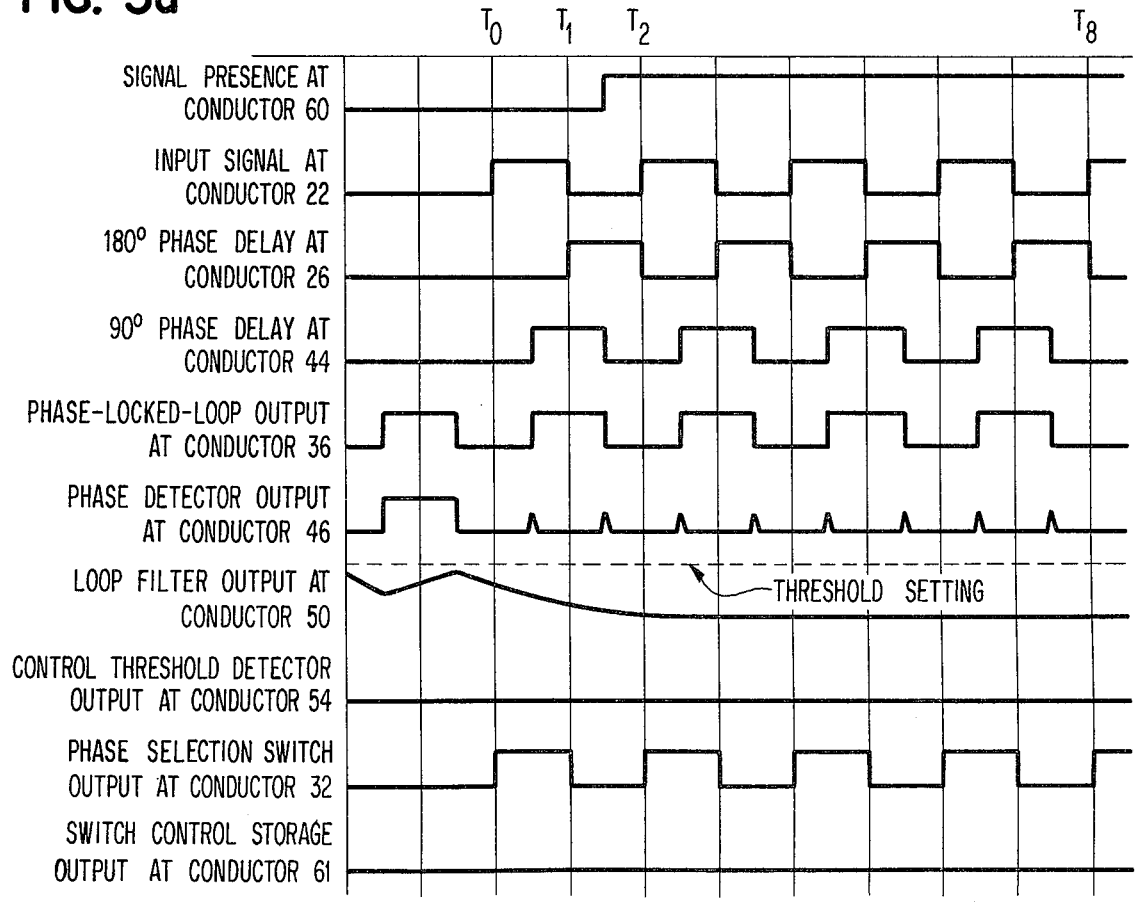
FIG. 3a is a timing diagram showing the interrelationship of the various wave forms of the present invention during the operation thereof at the stable null $\pi/2$.

Referring first to the block diagram of FIG. 2 and the timing diagram of FIG. 3a, at a time prior to $T_0$, there is no input signal; therefore, the signal at input signal conductor 22 is at a down or zero level. Consequently, the outputs of signal present indicator 58 at conductor 60, 180° phase delayer 24 at conductor 26 and 90° phase delayer 42 at conductor 44 are all at a down level. However, free-running phase-locked-loop 34 has an output at conductor 36 which is also the feedback signal to phase detector 40. Accordingly, phase detector 40 has an output at conductor 46. This output is filtered by means of loop filter 48, thereby, providing a filtered error signal at conductor 50. Nevertheless, control threshold detector 52 is not triggered since the filtered error signal at conductor 50 never reaches the threshold setting. Thus, the output of control threshold detector 52 at conductor 32 is at a down level. In addition, the outputs of phase selection switch 28 at conductor 32 and switch control storage device 56 at conductor 61 are also at a down level prior to T.

To continue, at a time slightly after $T_0$ an input signal appears at conductor 22 initiating a signal presence by means of signal presence indicator 58 at conductor 60. However, due to the circuit fabrication aforementioned in the "Description of the Preferred Embodiment" the signal is delayed appearing between times $T_1$ and $T_2$. In the mean time, however, the input signal passes through 90° phase delayer 42 which provides a delayed signal at conductor 44, an input of phase detector 40, between times $T_0$ and $T_1$. Also, the feedback signal at conductor 36 provides another input to phase detector 40. Thus, between times $T_0$ and $T_1$ the aforementioned signals are in phase as illustrated in FIG. 3a. Accordingly, the output of phase detector 40 at conductor 46 is at a down or zero level except for some minor noise transitions which are subsequently filtered by loop filter 48. Consequently, the output of loop filter 48, at conductor 50, falls to a level far below the threshold setting of control threshold detector 52 as indicated in FIG. 3a.

Still referring to FIG. 3a, between the times $T_1$ and $T_2$, signal presence indicator 58, as aforementioned, generates a step voltage. This voltage allows switch control storage device 56 to maintain its initial condition shown in FIG. 3a at conductor 61. Thus, the input signal is bypassed through phase selection switch 28 directly to the input of phase-locked-loop 34 at conductor 32.

Briefly summarizing the conditions illustrated in FIG. 3a, initially the output of phase-locked-loop 34 is at the stable null $\pi/2$. Accordingly, the output signal at conductor 36 tracks the input signal at conductor 22 with a phase delay of $\pi/2$. As depicted in FIG. 3a, acquisition or lock up occurs initially between the times $T_0$ and $T_1$ and continues subsequent to a time $T_8$ as long as a signal presence condition is maintained.

Figure 3B:
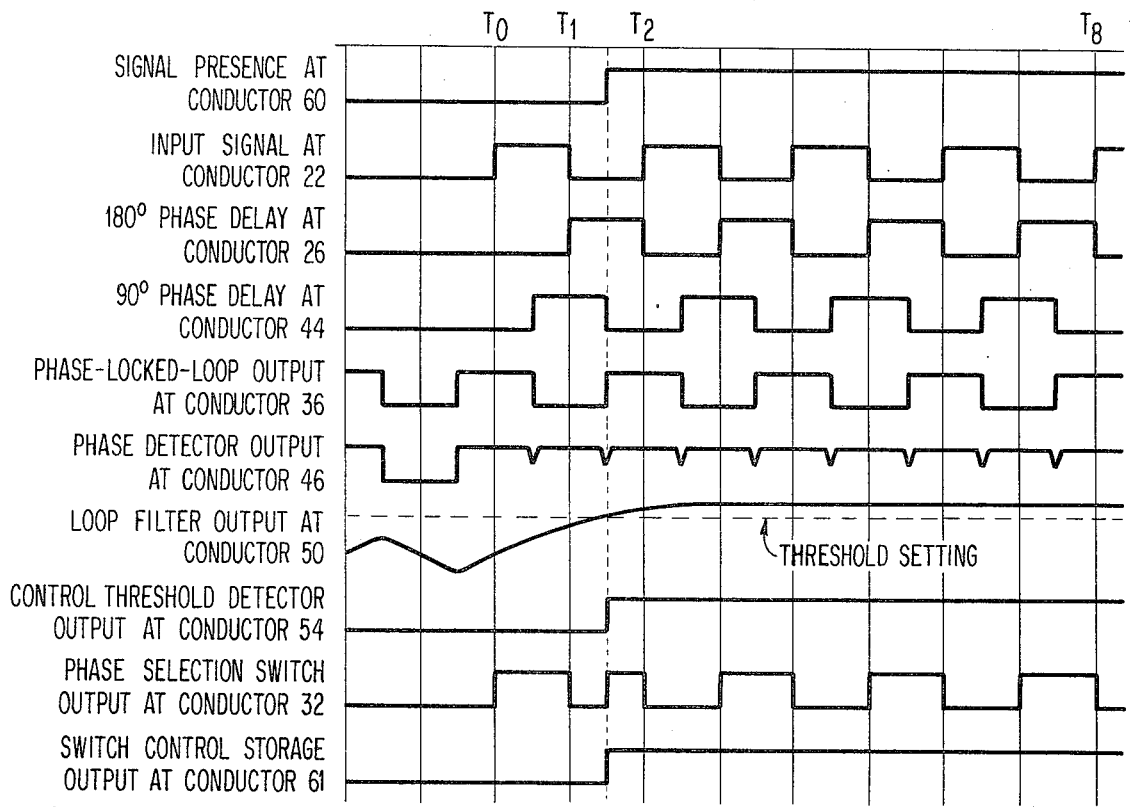
FIG. 3b is a timing diagram showing the interrelationship of the various wave forms of the present invention during the operation thereof at the unstable null $3\pi/2$ or $-3\pi/2$.

Referring again to the block diagram of FIG. 2 and now the timing diagram of FIG. 3b, the initial conditions are such that the output signal is 180° out of phase with the input signal, i.e., but for corrective action of the configuration of the present invention, lock up would occur at an unstable null. Prior to $T_0$, conditions are the same as in the previous example, except for the phase of the output signal at conductor 36. Also, as before, signal presence indicator 58 generates a signal at conductor 50 between the times $T_1$ and $T_2$.

At a time slightly after $T_0$, the conditions at conductors 36 and 44, the input to phase detector 40, are such that the output of phase detector 40 at conductor 46 is at a maximum level. Accordingly, the output signal of loop filter 48 at conductor 50 has a positive rising characteristic. Consequently, the threshold setting of control threshold detector 52 is reached at a time between $T_1$ and $T_2$ coinciding with the output of signal presence indicator 58 at conductor 60. Thus, control threshold detector 52 is activated providing a threshold step signal at conductor 54. The step signal or trigger on conductor 54 causes switch control storage device 56, which is also being triggered by signal presence indicator 58, to flip or change states, thereby, generating a control step signal at switch control storage device output conductor 61 as shown in FIG. 3b. The step signal at conductor 61 operates double pole-single throw switch 30, allowing the 180° delayed input signal at conductor 26 to pass through phase selection switch 28 to conductor 32.

Still referring to FIGS. 2 and 3b concurrently, the output of conventional free-running phase-locked-loop 34 at conductor 36 is driven off of the aforementioned unstable null towards the stable null $\pi/2$. Actually, prior to time $T_8$, the phase-locked-loop has not reached the stable null $\pi/2$, because, as indicated in FIG. 3b, the output signal is leading the input signal by $\pi/2$ or 90°. The proper phase for a locked condition is for the phase-locked-loop to lag the input signal by $\pi/2$ or 90°. However, acquisition is predictable, since the system has been switched off of the unstable null. Accordingly, at a time subsequent to $T_8$, the loop will lock up at the stable null $\pi/2$. Moreover, as aforementioned, given the conditions in FIG. 3b, acquisition is now a function only of controllable circuit parameters. It is possible with the circuit configuration of the instant invention, depending on the desired designed goals, to lock up in less than a cycle of the input signal by providing a higher order phase-locked-loop 34, tailoring the filter characteristic of loop filter 48, and so forth. These designed modifications, it is believed, are within the scope of the invention.

Figure 3C:
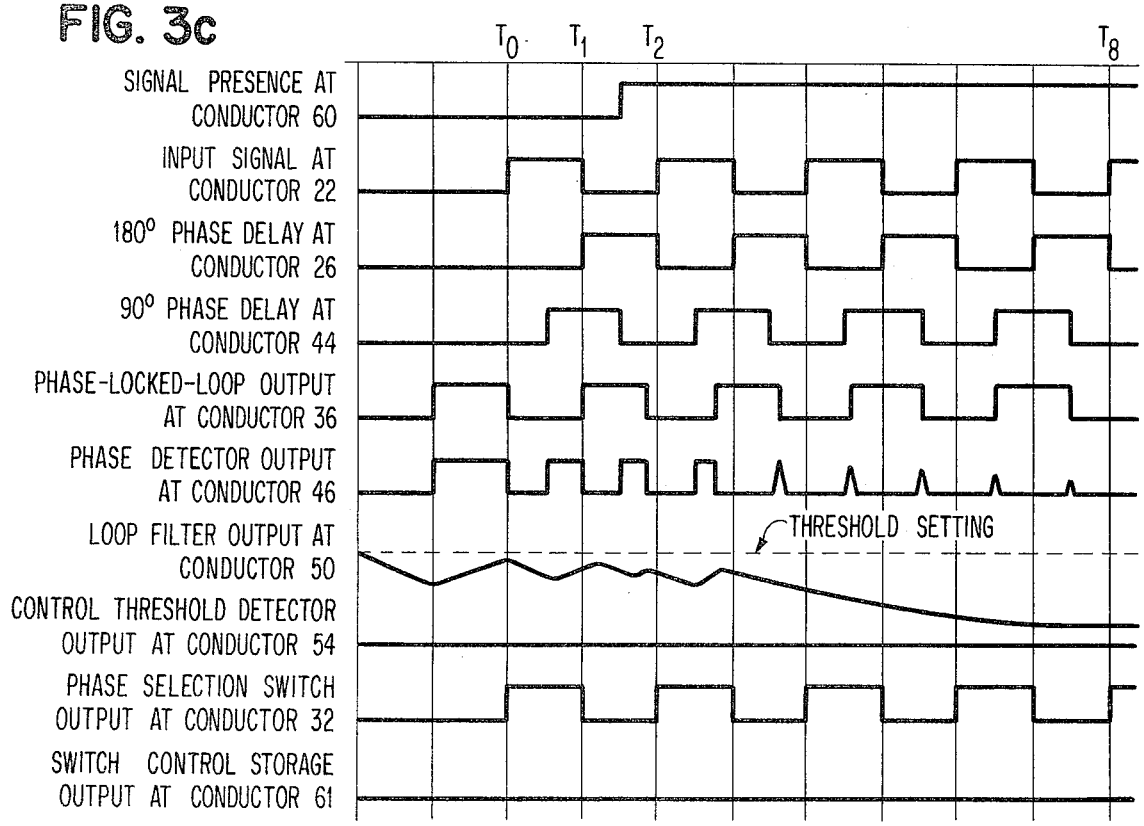
FIG. 3c is a timing diagram showing the interrelationship of the various wave forms of the present invention during the operation thereof at an intermediate point between the unstable null $3\pi/2$ and the stable null $\pi/2$ or the unstable null $-3\pi/2$ and the stable null $\pi/2$.

Finally, referring still to FIG. 2 and the timing diagram of FIG. 3c, a condition is illustrated where the conventional free-running phase-locked-loop 34 is at a phase between a stable null and an unstable null. In this instance, either of the conditions depicted in FIGS. 3a or 3b could occur. But as shown in FIG. 3c, at time $T_0$, the output of loop filter 48 at conductor 50 falls due to the down level of phase detector 40 at conductor 46. As illustrated in FIG. 3c, this level never rises about the threshold setting. Accordingly, the output of threshold detector 52 at conductor 54 is at a down level. Thus, the conditions are such that the output of switch control storage device 56 at conductor 61 is at a down level. Consequently, the input signal passes through phase selection switch 28 providing a signal at conductor 32 in the proper phase for conventional phase-locked-loop 34 to track the input signal in the proper manner. As tracking commences at $T_0$, the output of loop filter 48 at conductor 50 continues to fall further below the threshold setting until a time slightly before $T_8$. At the aforementioned time, the stable null $\pi/2$ is reached and lock up is completed. Further, as shown in FIG. 3c at conductor 36, the frequency of conventional phase-locked-loop 34 changes until lock up occurs.

It is important to note that the input signal, as shown in FIGS. 3a, 3b and 3c is depicted as an ideal signal for the purposes of illustrating and explaining the operation of the invention. In actual practice, the duty cycle of the input signal might vary due to transmission conditions. Nevertheless, the instant invention will operate properly with such a wave form.

While the invention has been particularly described with reference to the preferred embodiment thereof, it will be understood by those skilled in the art that various changes in form and detail may be made therein without departing from the spirit and scope of the invention.

What is claimed is:

1. A phase-locked-loop circuit configuration for improving the acquisition process comprising:

$3\pi/2$ phase detector means for comparing the phase between an input signal and a feedback signal providing at its output a threshold step signal proportional thereto;

signal presence indicator means driven by said input signal for generating an indicator step signal when an input signal is present;

180° phase delayer means driven by said input signal for delaying said input signal by substantially 180°;

phase selection switch means driven by said input signal, said threshold step signal from said $3\pi/2$ phase detector means and said delayed input signal from 180° phase delayer means for providing at its output a selected signal of the correct phase;

phase-locked-loop means driven by said correct selected phase signal from said phase selector switch means for generating an output signal proportional in phase and frequency to said input signal, and for generating said feedback signal;

said phase-locked-loop means tracking said input signal locking up at a stable null $\pi/2$, and eliminating the statistical nature of said acquisition process and decreasing the lock-up-time of said phase-locked-loop.

2. A phase-locked-loop circuit configuration as set forth in claim 1 wherein said $3\pi/2$ phase detector comprises:

90° phase delayer means driven by said input signal for generating a signal substantially delayed 90° from said input signal;

phase detector means driven by said 90° delayed signal and said feedback signal for comparing the phase thereof providing an error signal proportional thereto;

loop filter means driven by said error signal for filtering said error signal to smooth signal transitions and eliminate noise peaks; and control threshold detector means driven by said filtered error signal, said control threshold detector means having a threshold setting so that when said filtered error signal reaches said threshold setting, said control threshold detector means generates said threshold step signal.

3. A phase-locked-loop circuit configuration as set forth in claim 1 wherein said phase selection switch comprises:

switch control storage device means driven by said threshold step signal and said indicator step signal providing at its output a switch control step signal; and double pole-single throw switch means driven by said input signal, said 180° delayed input signal and said control step signal for passing a signal of the correct phase to said phase-locked-loop, to drive said phase-locked-loop to lock up on said stable null $\pi/2$.

* * * * *